United States Patent
Ide

(10) Patent No.: US 8,737,123 B2
(45) Date of Patent: May 27, 2014

(54) SEMICONDUCTOR DEVICE, INFORMATION PROCESSING SYSTEM INCLUDING SAME, AND CONTROLLER FOR CONTROLLING SEMICONDUCTOR DEVICE

(71) Applicant: Elpida Memory, Inc., Tokyo (JP)

(72) Inventor: Akira Ide, Tokyo (JP)

( * ) Notice: Subject to any disclaimer, the term of this patent is extended or adjusted under 35 U.S.C. 154(b) by 0 days.

(21) Appl. No.: 14/019,665

(22) Filed: Sep. 6, 2013

(65) Prior Publication Data

US 2014/0010034 A1 Jan. 9, 2014

Related U.S. Application Data

(63) Continuation of application No. 12/929,967, filed on Feb. 28, 2011, now Pat. No. 8,593,899.

(30) Foreign Application Priority Data

Mar. 1, 2010 (JP) .................................. 2010-044765

(51) Int. Cl.
*G11C 11/34* (2006.01)

(52) U.S. Cl.
USPC ...... 365/174; 365/63; 365/233.1; 365/230.01

(58) Field of Classification Search
USPC .............................. 365/174, 63, 233.1, 230.01
See application file for complete search history.

(56) References Cited

U.S. PATENT DOCUMENTS

| | | |
|---|---|---|
| 7,466,577 B2 | 12/2008 | Sekiguchi et al. |
| 2004/0257847 A1 | 12/2004 | Matsui et al. |
| 2007/0126105 A1 | 6/2007 | Yamada et al. |
| 2008/0025127 A1 | 1/2008 | Kanda et al. |
| 2009/0245003 A1* | 10/2009 | Ito .................................. 365/211 |
| 2012/0114086 A1 | 5/2012 | Hayashi |

FOREIGN PATENT DOCUMENTS

JP 2007-157266 A 6/2007

* cited by examiner

*Primary Examiner* — Vu Le
*Assistant Examiner* — Han Yang
(74) *Attorney, Agent, or Firm* — McGinn IP Law Group, PLLC

(57) ABSTRACT

A system includes a control chip and a plurality of command terminals receiving a plurality of command signals, respectively; a command decoder coupled to the command terminals, the command decoder being configured to output an internal command in response to the command signals; and a layer address buffer configured to output a layer address each time the command decoder outputs a row command as the internal command and outputs a column command as the internal command; and a plurality of core chips stacked with one another, each of the core chips being configured to receive the, row command and the layer address output together with the row command, to receive the column command and the layer address output together with the column command, and to free from receiving the command signals.

7 Claims, 19 Drawing Sheets

| OPTION | NUMBER OF LAYERS | PAGE SIZE | LAYER ADDRESS | ROW/COLUMN ADDRESS |
|---|---|---|---|---|
| 1 | 2 | 1KByte | A15 | A14~A0 |
| 2 | 4 | 1KByte | A16, A15 | A14~A0 |
| 3 | 4 | 2KByte | A15, A14 | A13~A0 |
| 4 | 8 | 1KByte | A17, A16, A15 | A14~A0 |

FIG.16

SEMICONDUCTOR DEVICE, INFORMATION PROCESSING SYSTEM INCLUDING SAME, AND CONTROLLER FOR CONTROLLING SEMICONDUCTOR DEVICE

RELATED APPLICATIONS

This application is a Continuation application of U.S. patent application Ser. No. 12/929,967, filed on Feb. 28, 2011, which, in turn, claims priority to Japanese Patent Application 2010-044765, filed on Mar. 1, 2010.

BACKGROUND OF THE INVENTION

1. Field of the Invention

The present invention relates to a semiconductor device and an information processing system including the same, and more particularly to a semiconductor device which includes a plurality of core chips and an interface chip for controlling the same and an information processing system which includes the semiconductor device.

2. Description of Related Art

DRAM (Dynamic Random Access Memory) as a typical semiconductor memory device, is usually used in the form of a memory module where a plurality of chips are mounted on a module substrate. FIG. 18 is a schematic diagram for explaining the connection between a memory module and a controller. In the shown example, a memory module composed of two ranks 904a and 904b is connected to a controller 902. The two ranks 904a and 904b belong to rank 1 and rank 2, respectively, and are exclusively activated by respective corresponding chip select signals CS1 and CS2.

Each rank includes eight 2-Gbit DRAM chips 900 (900A to 900H). The memory capacity per rank is thus 16 Gbits, and the system has a total memory capacity of 32 Gbits. Each DRAM chip 900 has eight data input-output terminals DQ, so that 64 bits of data is input/output between the ranks 904a and 904b and the controller 902 at a time. Data wiring for transmitting and receiving such 64 bits of data is connected to rank 1 (904a) and rank 2 (904b) in common.

Similarly, command and address wiring for supplying an address ADD, command CMD, and bank address BA from the controller 902 to the two ranks 904a and 904b is also connected to rank 1 (904a) and rank 2 (904b) in common. Consequently, the same address, command, and bank address are supplied from the controller 902 to the two ranks 904a and 904b. Which of the ranks the addresses and command are enabled in is identified by the chip select signals CS1 and CS2.

FIG. 19 is a schematic diagram for explaining the bank configuration of rank 1 (904a) which is activated by the chip select signal CS1.

As shown in FIG. 19, the eight DRAM chips 900A to 900H that constitute rank 1 (904a) each have eight banks including banks 0 to 7. The banks are units that can accept commands independently. When a bank is executing a predetermined command, a new command can be issued to another bank. The banks are specified by the foregoing bank address.

The address ADD, command CMD, and bank address BA (BA2 to BA0) are supplied to the DRAM chips 900A to 900H in common. For example, when in a read operation, eight bits of read data is read from each memory cell to which the same address is assigned, in each bank to which the same bank address is assigned. As a result, a total of 64 bits of read data is output to the controller 902. The entire address space of rank 1 (904a) is thus the same as that of a single DRAM chip.

Meanwhile, demands on DRAM memory capacity are increasing year by year. In order to meet the demands, there has been proposed a memory device called multi-chip package which includes a plurality of memory chips stacked on each other. A memory chip typically includes a so-called front end unit which provides an interface with outside (such as a memory controller). The available area that can be allocated for memory cores in a memory chip is limited to the total chip area minus the footprint of the front end unit.

As a method to resolve the above problem, a method that integrates the front end unit and the back end unit in individual chips and laminates these chips, thereby constituting one semiconductor memory device, is suggested (for example, Japanese Patent Application Laid-Open (JP-A) No. 2007-157266). According to this method, with respect to plural memory chips each of which is integrated with the back end unit without the front end unit, it becomes possible to increase a memory capacity for each chip (for each memory chip) because an occupied area assignable for the memory core increases. Meanwhile, with respect to an interface chip that is integrated with the front end unit and is common to the plural core chips, it becomes possible to form its circuit with a high-speed transistor because the interface chip can be manufactured using a process different from that of the memory core. In addition, since the plural memory chips (core chips) can be allocated to one interface chip, it becomes possible to provide a semiconductor memory device that has a large memory capacity and a high operation speed as a whole.

For example, instead of the eight DRAM chips 900A to 900H shown in FIG. 19, a semiconductor device including a stack of eight core chips and one interface chip can be used to obtain the same memory capacity as that of rank 1 (904a) in a single package. In such a configuration, it is not the case, as with rank 1 (904a), that pieces of data read from the respective DRAM chips are output to the controller 902 in parallel. Instead, any one of the core chips is selected and a piece of data read from the selected core chip is output to the controller 902 through the interface chip. The address space is thus extended eightfold as compared to a single DRAM chip.

Even with the eightfold address space, the number of banks that appear to the controller 902 is still eight. The memory access efficiency is therefore little improved despite the increased memory capacity per package.

SUMMARY

In one embodiment, there is provided a controller for controlling a semiconductor device that has a plurality of chips each having a plurality of banks that includes: an address control circuit that outputs a chip address for selecting any one of the plurality of chips, a bank address for selecting any one of the plurality of banks, and a row address and a column address for selecting a memory cell in a bank; and a command control circuit that outputs a row command and a column command. The address control circuit outputs the chip address, the bank address, and the row address when the command control circuit outputs the row command, and outputs the chip address, the bank address, and the column address when the command control circuit outputs the column command.

In one embodiment, there is provided a semiconductor device that includes: a plurality of core chips that have a plurality of banks each; a chip address terminal that receives a chip address for selecting any one of the plurality of core chips; a bank address terminal that receives a bank address for selecting any one of the plurality of banks; a row/column address terminal that receives a row address and a column address for selecting a memory cell in a bank; a command terminal that receives command information; and an access control circuit that, based on the chip address, the bank address, and the row address received in synchronization with the row command, and the chip address, the bank address, and the column address received in synchronization with the column command, accesses a memory cell selected by the row address and column address in a bank selected by the bank address in a core chip selected by the chip address.

In one embodiment, there is provided an information processing system includes: the foregoing controller and the foregoing semiconductor device; a first wiring that supplies the chip address output from the controller to the chip address terminal of the semiconductor device; a second wiring that supplies the bank address output from the controller to the bank address terminal of the semiconductor device; a third wiring that supplies the row address and the column address output from the controller to the row/column address terminal of the semiconductor device; and a fourth wiring that supplies the row command and the column command output from the controller to the command terminal of the semiconductor device.

According to the present invention, it is possible to increase the number of banks recognizable to the controller, thereby improving the memory access efficiency of the semiconductor device including the plurality of memory chips.

BRIEF DESCRIPTION OF THE DRAWINGS

The above features and advantages of the present invention will be more apparent from the following description of certain preferred embodiments taken in conjunction with the accompanying drawings, in which:

FIG. 16 is a chart showing the relationship between the number of layers of memory cores MC and address configuration;

DETAILED DESCRIPTION OF THE EMBODIMENTS

Preferred embodiments of the present invention will be explained below in detail with reference to the accompanying drawings.

Figure 1:
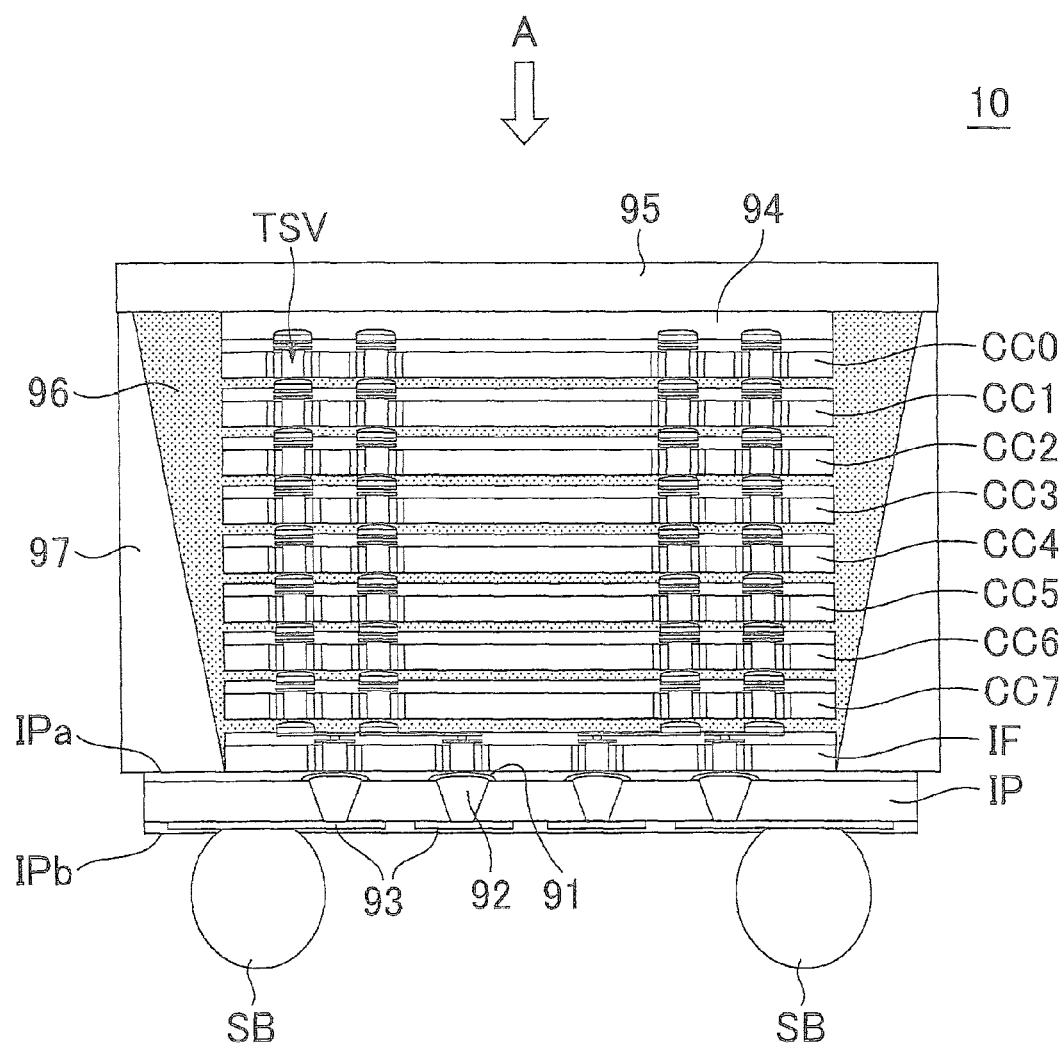
FIG. 1 is a schematic cross-sectional view illustrating a structure of a semiconductor memory device according to a preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) (penetration electrodes) penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a read frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
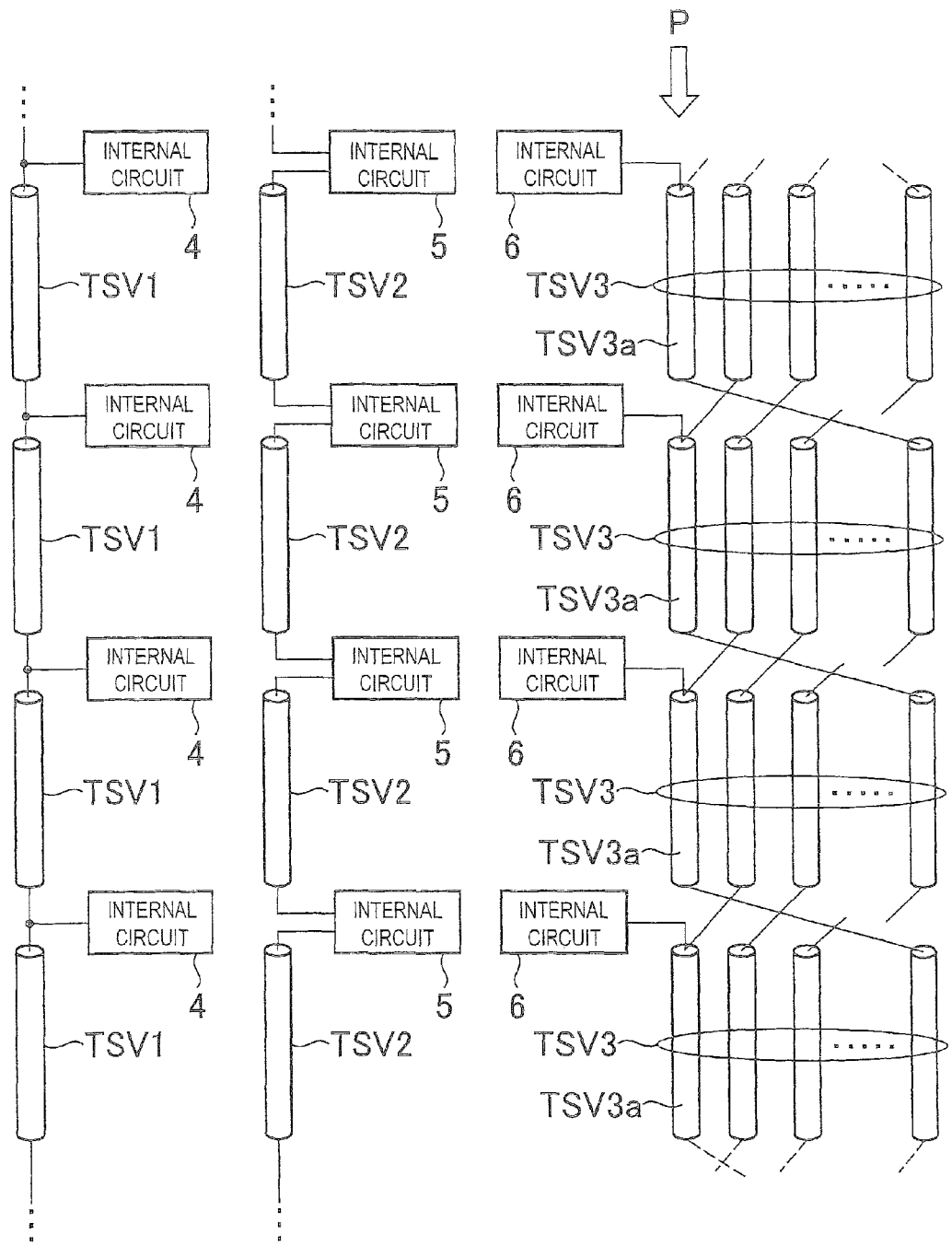
FIGS. 2A to 2C are diagrams showing the various types of through silicon vias TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV are wired-ORed and input to the interface chip IF.

Meanwhile, as shown in FIG. 2B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, layer address information to be described below is exemplified.

Another through silicon via TSV group is short-circuited from the through silicon vias TSV of other layer provided at the different position in plan view, as shown in FIG. 2C. With respect to this kind of through silicon via TSV group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the through silicon vias TSV provided in the core chips CC0 to CC7, three types (through silicon via TSV1 to through silicon via TSV3) shown in FIGS. 2A to 2C exist. As described above, most of the through silicon vias TSVs are of a type shown in FIG. 2A, and an address signal, a command signal, and a clock signal are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon via TSV2 and through silicon via TSV3 of the types shown in FIGS. 2B and 2C are used to provide individual information to the core chips CC0 to CC7 having the same structure.

Figure 3:
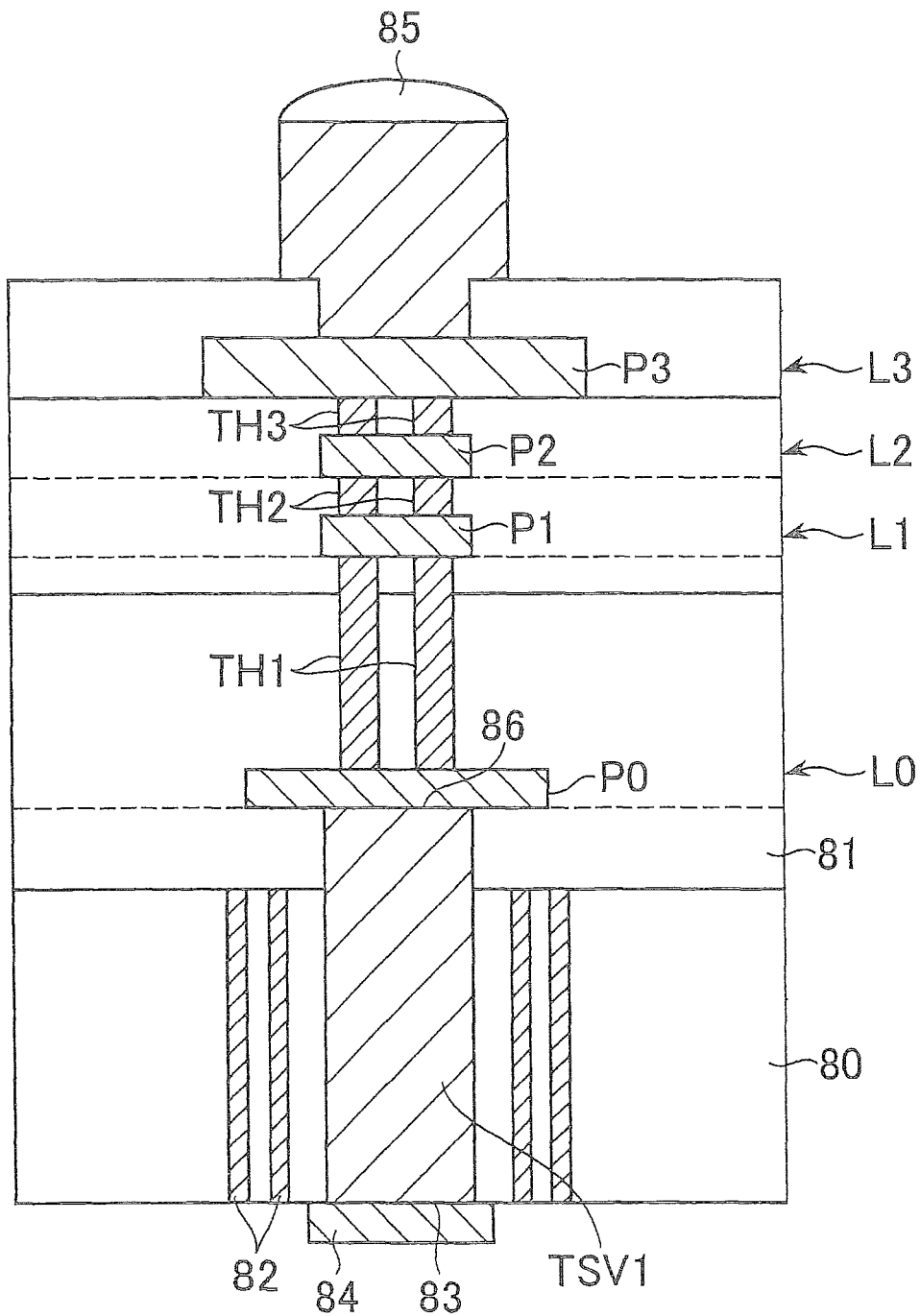
FIG. 3 is a cross-sectional view illustrating a structure of the through silicon via TSV of the type shown in FIG. 2A.

FIG. 3 is a cross-sectional view illustrating the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
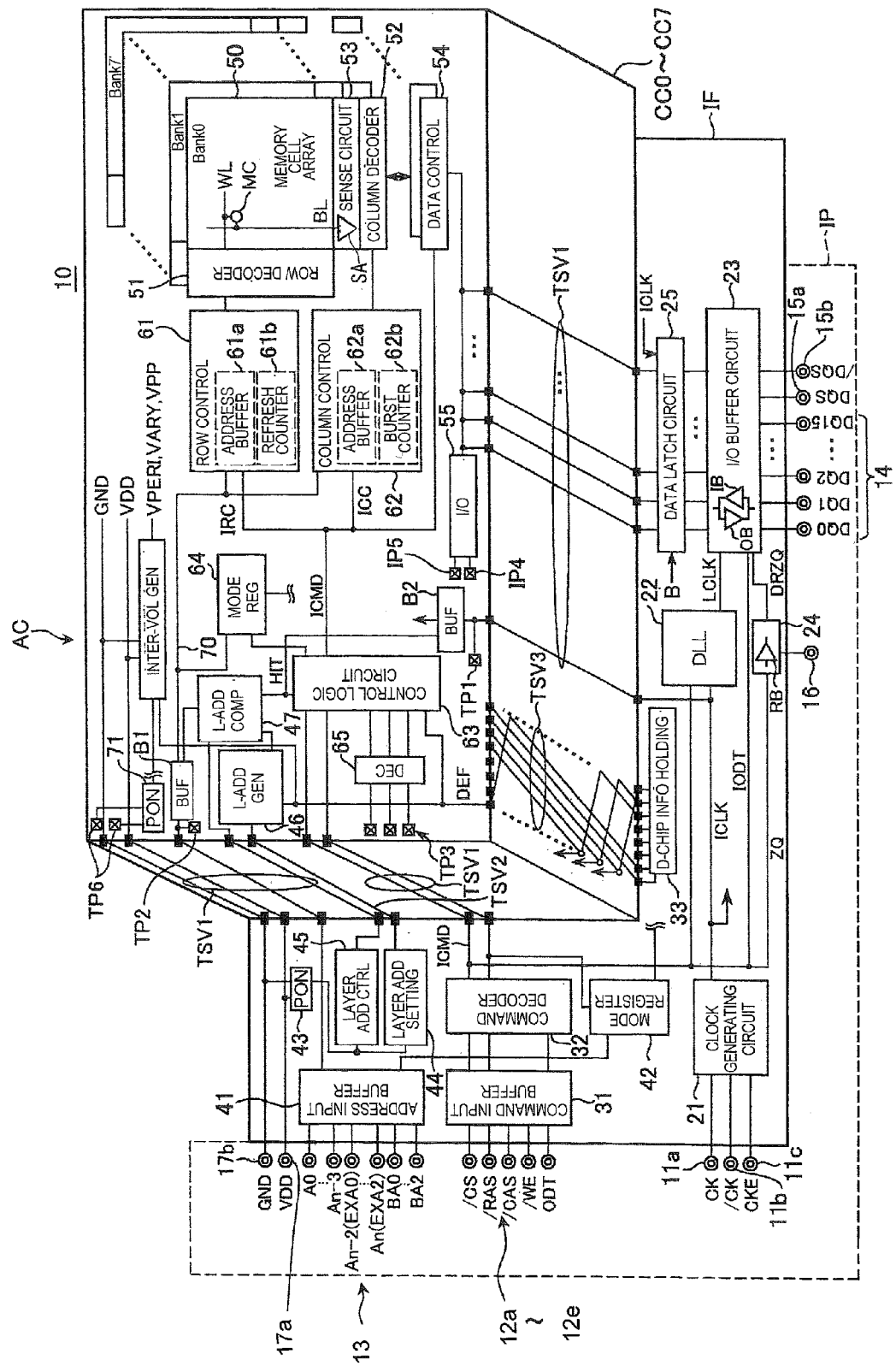
FIG. 4 is a block diagram illustrating a circuit configuration of the semiconductor memory device 10.

FIG. 4 is a block diagram illustrating the circuit configuration of the semiconductor memory device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to An and bank address BA0 to BA2 are supplied, and the supplied address signals A0 to An and the bank address BA0 to BA2 are supplied to an address input buffer 41 provided in the interface chip IF. Details will be described later, but of the address signals A0 to An, the address signal A0 to An−3 is used as a row address or a column address and the address signal An−2 to An is used as layer address (chip address) EXA0 to EXA2 identifying the core chips CC0 to CC7. An output of the address input buffer 41 is commonly supplied to the core chips CC0 to CC7 through the through silicon vias TSV. At least a part of the address signals A0 to An are supplied to a mode register 42 provided in the interface chip IF, when the semiconductor memory device 10 enters a mode register set. The bank address BA0 to BA2 and the layer address EXA0 to EXA2 are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel.

This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon via TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon via TSV. The power-on detecting circuit 43 detects the supply of power. On detecting the supply of power, the power-on detecting circuit activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon via TSV.

The interface chip IF is also provided with a layer address setting circuit 44. The layer address setting circuit 44 is connected to the core chips CC0 to CC7 through the through silicon via TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon via TSV. The defective chip information holding circuit 33 is connected to the core chips CC0 to CC7 while being shifted, using the through silicon via TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

Since the core chips CC0 to CC7 include eight banks each, the semiconductor memory device 10 includes a total of 64 banks. The semiconductor memory device 10 according to the present embodiment has a first operation mode where the 64 banks are identified as respective different banks, and a second operation mode where corresponding banks in the respective core chips CC0 to CC7 are identified as an identical bank. Such operation modes are set in mode registers 42 and 64. Among various circuits included in the core chips CC0 to CC7, those other than the memory cell array 50 constitute an access control circuit.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like)

which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a EXA (chip selection information) which is a part of the address signal supplied from the interface chip IF through the through silicon via TSV and a layer address LID (chip identification information) set to the layer address generating circuit 46.

In the layer address generating circuit 46, unique layer addresses are set to the core chips CC0 to CC7, respectively, at initialization. Therefore, the layer address generating circuit 46 constitutes a chip address holding circuit. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI ($\approx$VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

Figure 5:
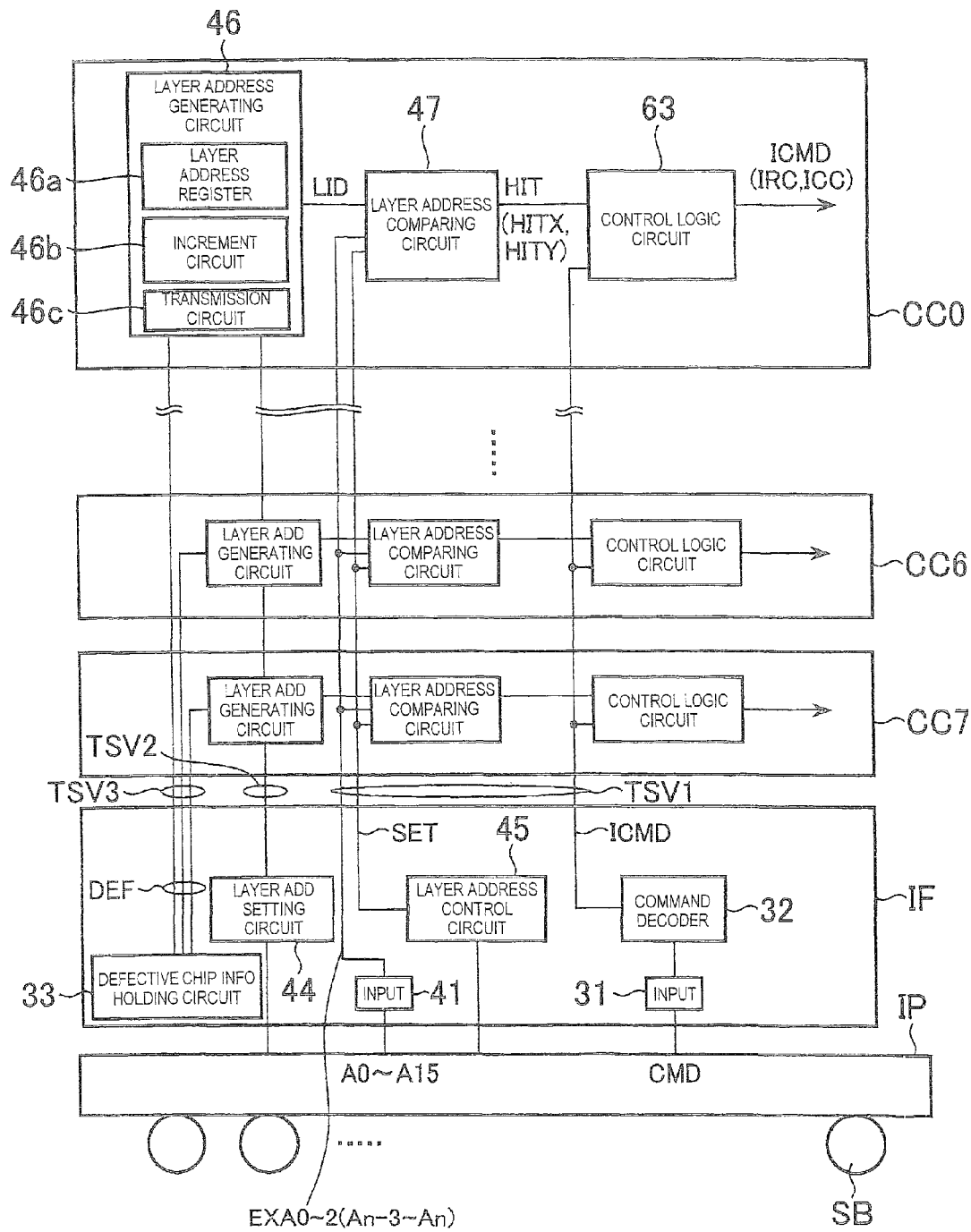
FIG. 5 is a diagram showing a circuit associated with selection of core chips CC0 to CC7.

FIG. 5 is a diagram showing a circuit associated with selection of the core chips CC0 to CC7.

As shown in FIG. 5, the layer address generating circuits 46 are provided in the core chips CC0 to CC7, respectively, and are cascade-connected through the through silicon via TSV2 of the type shown in FIG. 2B. The layer address generating circuit 46 includes a layer address register 46a, an increment circuit 46b, and a transmission circuit 46c.

The layer address register 46a holds a layer address (chip identification information) LID of 3 bits. When the power supply is detected by the power-on detecting circuit 71 shown in FIG. 4, a register value is initialized to a minimum value (0, 0, 0). In the core chip CC0 of the uppermost layer, the increment circuit 46b increments an layer address LID (0, 0, 0) in the layer address register 46a and the incremented value (0, 0, 1) is transmitted to the core chip CC1 of the lower layer by the transmission circuit 46c. A transmitted layer address LID (0, 0, 1) is set to the layer address register 46a of the core chip CC1.

Even in the core chip CC1, a value (0, 1, 0) that is obtained by incrementing the layer address LID (0, 0, 1) in the layer address register 46a by the increment circuit 46b is transmitted to the core chip CC2 of the lower layer by the transmission circuit 46c.

Hereinafter, in the same way as the above case, the incremented layer addresses LID are sequentially transmitted to the core chips of the lower layers. Finally, a maximum value (1, 1, 1) is set to the layer address register 46a of the core chip CC7 of the lowermost layer. Thereby, each of the core chips CC0 to CC7 has a unique layer address LID.

A defective chip signal DEF is supplied from the defective chip information holding circuit 33 of the interface chip IF to the layer address generating circuit 46 through the through silicon via TSV3 of the type shown in FIG. 2C. The defective chip signal DEF is a signal of 8 bits and the bits are supplied to the corresponding core chips CC0 to CC7. The core chip where the corresponding bits of the defective chip signal DEF is activated is the defective chip. In the core chip where the corresponding bits of the defective chip signal DEF is activated, the transmission circuit 46c transmits, to the core chip of the lower layer, a non-incremented layer address LID, not an incremented layer address LID. In other words, the LID allocating of defective chip is skipped. That is, the layer address LID that is allocated to each of the core chips CC0 to CC7 is not fixed and changes according to the defective chip signal DEF. The same layer address LID as the lower layer is allocated to the defective chip. However, since the control logic circuit 63 is prohibited from being activated in the defective chip, a read operation or a write operation is not securely performed, even though an address signal or a command signal is input from the interface chip IF.

The layer address LID is further supplied to the layer address comparing circuit (chip information comparing circuit) 47 in each of the core chips CC0 to CC7. The layer address comparing circuit 47 compares the layer address LID (chip identification information) supplied from the layer address generating circuit 46 and a part of the address signal (chip selection information EXA) supplied from the interface chip IF through the through silicon via TSV. As the address signal is commonly supplied to the core chips CC0 to CC7 through the through silicon via TSV1 of the type shown in FIG. 2A, the core chip where matching is detected as a comparison result by the layer address comparing circuit 47 is only one.

The address signal supplied from the interface chip IF includes a row address, a column address, a bank address, and a layer address (chip address). Specifically, when an active command is input to the command terminals 12a to 12e, a row address, a bank address, and a layer address are input to the address terminals 13 in synchronization with the active command. The addresses are supplied to the core chips CC0 to CC7 in common through the interface chip IF. Commands that are issued in synchronization with a row address, such as an active command, will be referred to as "row commands." In the meantime, when a read command or a write command is input to the command terminals 12a to 12e, a column address, a bank address, and a layer address are input to the address terminals 13 in synchronization with the command. The addresses are supplied to the core chips CC0 to CC7 in common through the interface chip IF. Commands that are issued in synchronization with a column address, such as a read command and a write command, will be referred to as "column commands." In the semiconductor memory device 10 according to the present embodiment, a chip select signal EXA which indicates a layer address is issued in synchronization with both a row command and a column command. The layer address comparing circuit 47 therefore performs a comparison operation both when a row command is issued and when a column command is issued.

The foregoing address input method is an address input method that is used when the first operation mode is set in the mode registers 42 and 64. As mentioned above, the first operation mode is where a total of 64 banks included in the core chips CC0 to CC7 are identified as respective different banks. On the other hand, if the second operation mode is set in the mode registers 42 and 64, a row address, a bank address, and a layer address are input in synchronization with a row command while a column address and a bank address are input in synchronization with a column command. That is, when the second operation mode is set in the mode registers 42 and 64, no layer address is input when a column command is issued. As mentioned above, the second operation mode is where corresponding banks in the respective core chips CC0 to CC7 are identified as an identical bank.

Figure 6A:
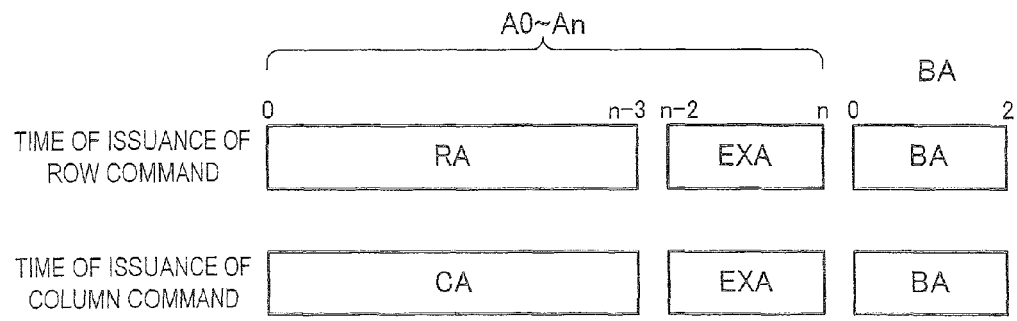
FIGS. 6A and 6B are schematic diagrams for explaining address assignment, FIG. 6A showing the address assignment in a first operation mode, FIG. 6B showing the address assignment in a second operation mode.
Figure 6B:
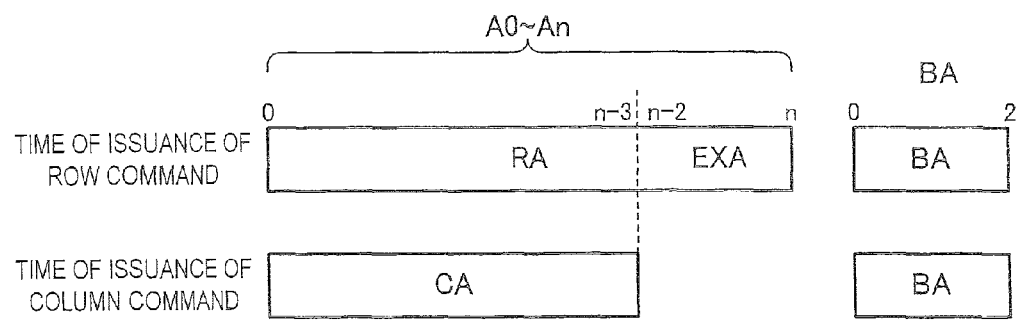

FIGS. 6A and 6B are schematic diagrams for explaining address assignment. FIG. 6A shows the address assignment in the first operation mode. FIG. 6B shows the address assignment in the second operation mode.

As shown FIG. 6A, when entering in the first operation mode, the address signal An-2 to An is used as the layer address EXA0 to EXA2 both at the time of issuance of a row command and at the time of issuance of a column command. The layer address EXA0 to EXA2 that is input at the time of issuance of a row command has the same value as that of the layer address EXA0 to EXA2 that is input at the time of issuance of a column command. The rest of the address signal, A0 to An-3, is used as a row address RA when a row command is issued, and used as a column address CA when a column command is issued. The input value of the bank address BA0 to BA2 is the same both when a row command is issued and when a column command is issued.

On the other hand, when entering in the second operation mode, as shown in FIG. 6B, the address signal A0 to An is used as a row address RA when a row command is issued. When a column command is issued, the address signal A0 to An-3 is used as a column address CA. Of the row address RA, the part consisting of the address signal An-2 to An corresponds to the layer address EXA0 to EXA2. Unlike the bank address BA0 to BA2, it is not the case that the layer address of the same value is input both when a row command is issued and when a column command is issued, but the layer address is input only when a row command is issued. The layer address is thus handled as a part of the row address RA. When a column command is issued, the part consisting of the address signal An−2 to An is unused.

Which part of the address signal to use as chip select information EXA depends on I/O configuration. More specifically, the chip select information EXA is not fixed but can vary according to the I/O configuration. As employed herein, the I/O configuration will refer to the configuration of the number of bits of unit external data to be simultaneously input/output from/to outside. The I/O configuration can be set by blowing fuses or by means of bonding options.

According to the I/O configuration selected, the layer address control circuit 45 specifies by a specification signal SET which part of the address signal to use as the chip select information EXA. The specification signal SET is supplied to the layer address comparing circuits 47 of the core chips CC0 to CC7 in common through through silicon vias TSV. Each layer address comparing circuit 47 compares a layer address LID supplied from the layer address generating circuit 46 with chip select information SEL supplied from the interface chip IF, and activates a coincidence signal HIT if the layer address LID and the chip select information SEL coincide with each other. The coincidence signal HIT is supplied to the control logic circuit 63 in that core chip. The control logic circuit 63 is activated by the coincidence signal HIT and enables the internal command ICMD which is supplied from the interface chip IF through silicon vias TSV. Among internal commands enabled, an internal row command IRC is supplied to the row control circuit 61 shown in FIG. 4 and an internal column command ICC is supplied to the column control circuit 62 shown in FIG. 4. On the other hand, if the coincidence signal HIT is not activated, the control logic circuit 63 disables the internal command ICMD. In consequence, the internal command ICMD which is supplied to the core chips CC0 to CC7 in common is enabled in any one of the core chips CC0 to CC7.

Figure 7:
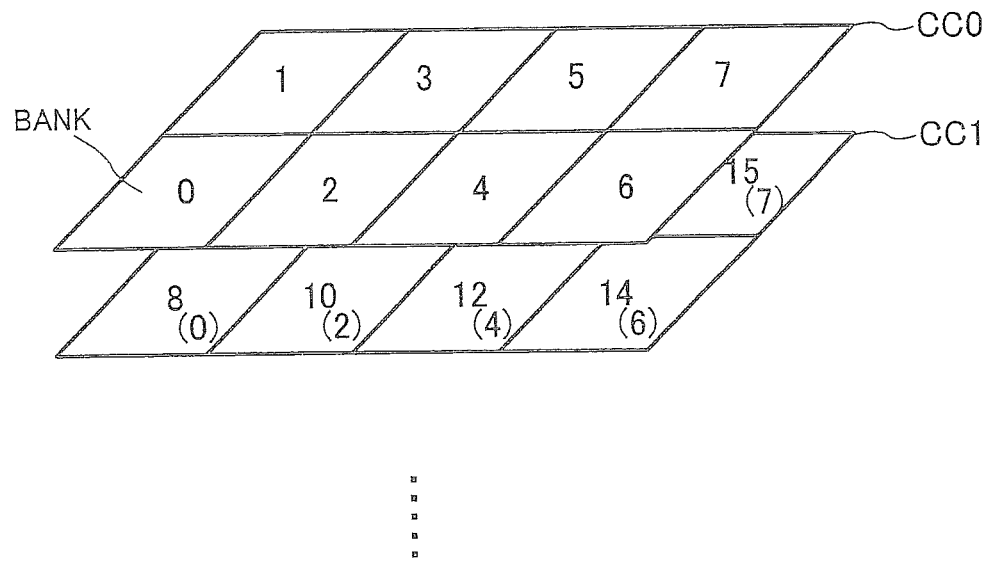
FIG. 7 is a conceptual diagram showing the bank configuration in the first operation mode.
Figure 7:
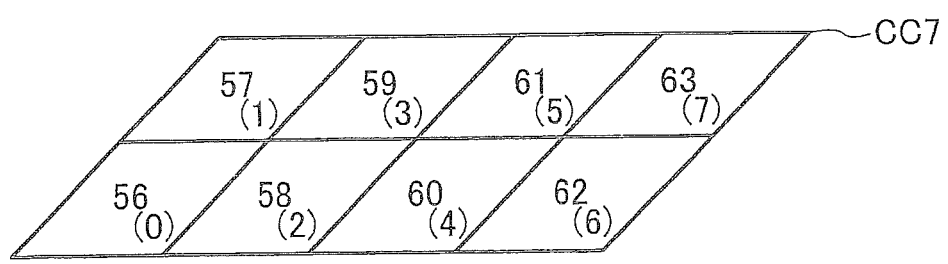
Figure 8:
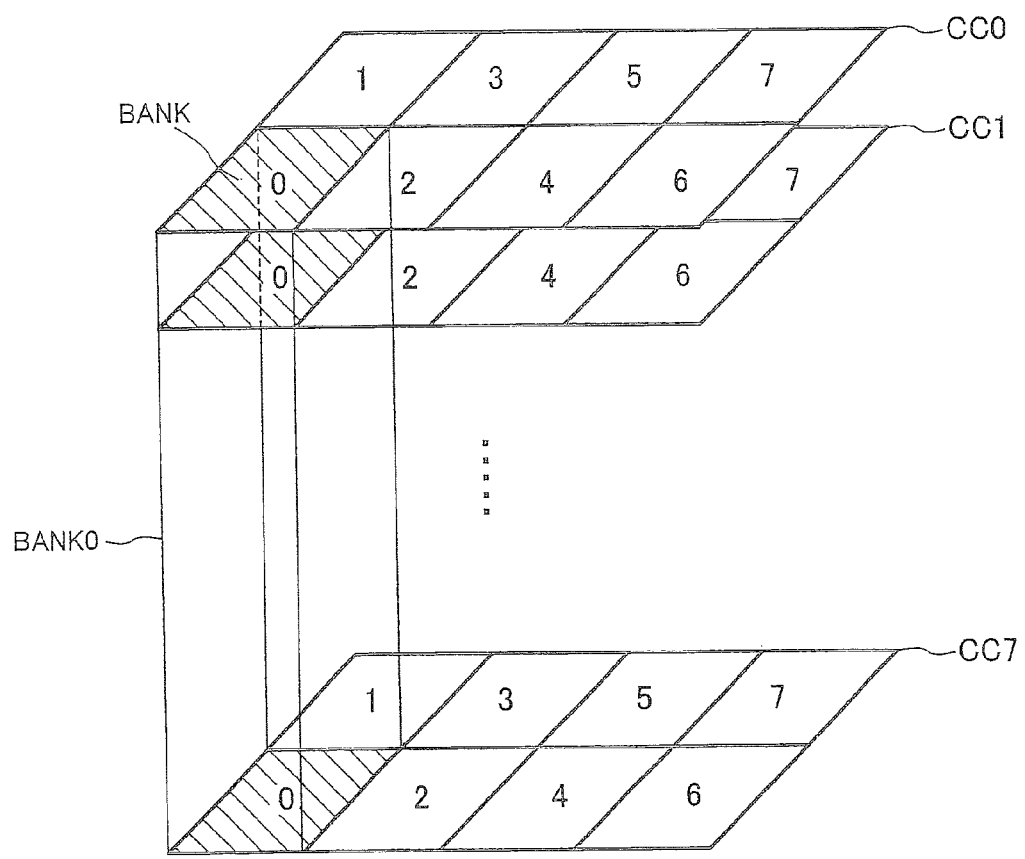
FIG. 8 is a conceptual diagram showing the bank configuration in the second operation mode.

FIG. 7 is a conceptual diagram showing the bank configuration in the first operation mode. FIG. 8 is a conceptual diagram showing the bank configuration in the second operation mode.

As shown in FIG. 7, when entering in the first operation mode, a total of 64 banks included in the core chips CC0 to CC7 are identified as respective different banks. The memory therefore appears to outside as having 64-bank configuration including bank 0 to bank 63. When entering in the second operation mode, as shown in FIG. 8, corresponding banks in the respective core chips CC0 to CC7 are identified as an identical bank. FIG. 8 shows the case where the banks 0 included in the respective core chips CC0 to CC7 are collectively recognized as a single bank. The memory therefore appears to outside as having mere 8-bank configuration including bank 0 to bank 7.

The semiconductor memory device 10 according to the present embodiment has been overviewed so far. Next, description will be given of an information processing system that uses the semiconductor memory device 10 according to the present embodiment.

Figure 9:
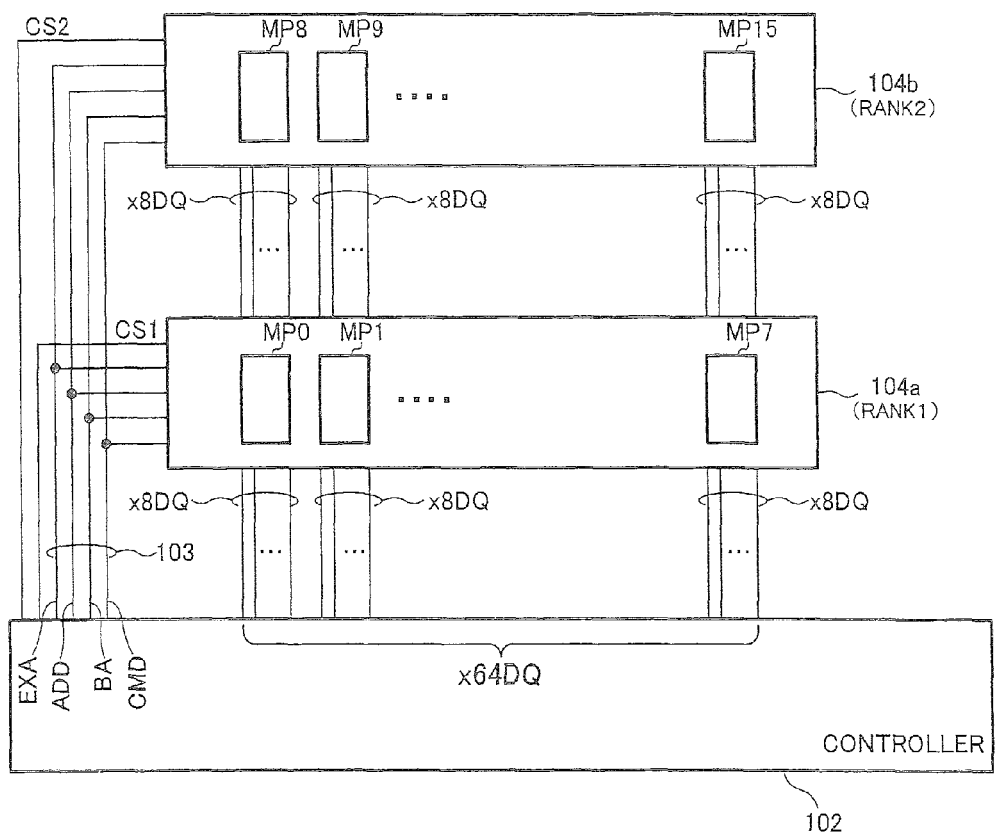
FIG. 9 is a configuration diagram of an information processing system 104 which uses the semiconductor memory device 10.

FIG. 9 is a configuration diagram of an information processing system 104 which uses the semiconductor memory device 10.

The information processing system 104 shown in FIG. 9 is configured so that a controller 102 is connected with a memory module which includes two ranks 104a and 104b. The rank 104a includes eight memory packages MP0 to MP7. The rank 104b includes eight memory packages MP8 to MP15. Each of the memory packages MP0 to MP15 corresponds to one semiconductor memory device 10 described above. That is, eight core chips CC0 to CC7 and one interface chip IF are implemented in each memory package MP.

The ranks 104a and 104b belong to rank 1 and rank 2, respectively, and are exclusively activated by respective corresponding chip select signals CS1 and CS2. The chip select signals CS1 and CS2 correspond to the chip select signal that is input to the command terminal 12d shown in FIG. 4. In the present example, each memory package MP has eight data input-output terminals DQ, so that 64 bits of data is input/output between the ranks 104a and 104b and the controller 102 at a time. Data wiring for transmitting and receiving such 64 bits of data is connected to the ranks 104a and 104b in common.

Similarly, command and address wiring 103 for supplying an address signal ADD, a command CMD, a bank address BA, and a layer address EXA from the controller 102 to the ranks 104a and 104b is also connected to the ranks 104a and 104b in common. As a result, the same address signal A0 to An−3, command CMD, bank address BA, and layer address EXA are supplied from the controller 102 to the ranks 104a and 104b. Which of the ranks the addresses and command are enabled in is identified by the chip select signals CS1 and CS2.

Figure 10:
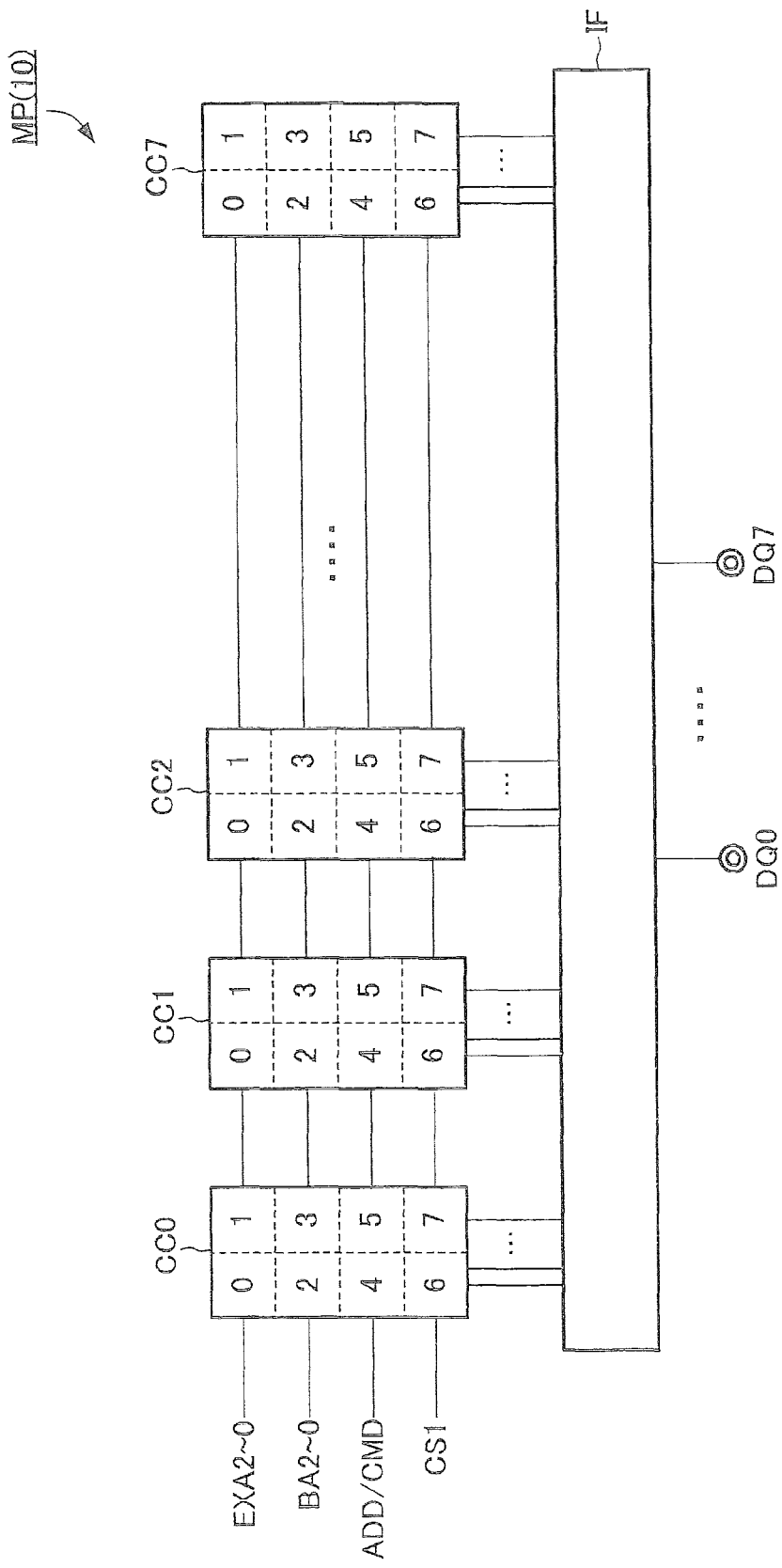
FIG. 10 is a schematic diagram for explaining the bank configuration of a single memory package MP that is activated by a chip select signal CS1.

FIG. 10 is a schematic diagram for explaining the bank configuration of a memory package MP (semiconductor memory device 10) that is activated by the chip select signal CS1.

Figure 19:
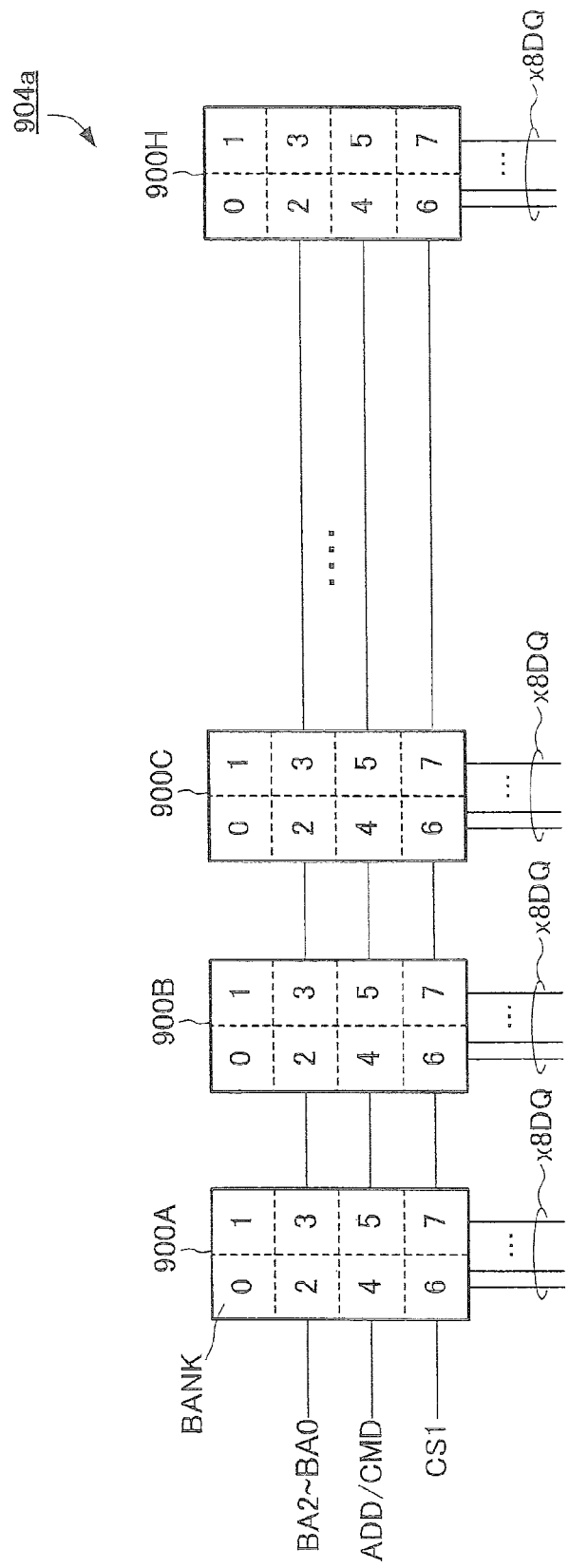
FIG. 19 is a schematic diagram for explaining a bank configuration of a memory module 904*a* which is activated by a chip select signal CS1.

As shown in FIG. 10, the eight core chips CC0 to CC7 included in the memory package MP each have eight banks including banks 0 to 7. The address signal A0 to An−3, command CMD, bank address BA0 to BA2, and layer address EXA0 to EXA2 are supplied to the core chips CC0 to CC7 in common. As mentioned above, when a row command is input, a row address RA, bank address BA0 to BA2, and layer address EXA0 to EXA2 are supplied to the core chips CC0 to CC7 in common in synchronization with the row command. When a column command is input, a column address CA, bank address BA0 to BA2, and layer address EXA0 to EXA2 are supplied to the core chips CC0 to CC7 in common in synchronization with the column command. Since the bank address BA0 to BA2 and the layer address EXA0 to EXA2 are supplied both when a row command is issued and when a column command is issued, one of the banks in one of the core chips is specified both when a row command is issued and when a column command is issued. This means that a total of 64 banks included in one memory package MP are handled as respective independent banks. This is the fundamental difference from the memory module shown in FIG. 19.

Figure 11:
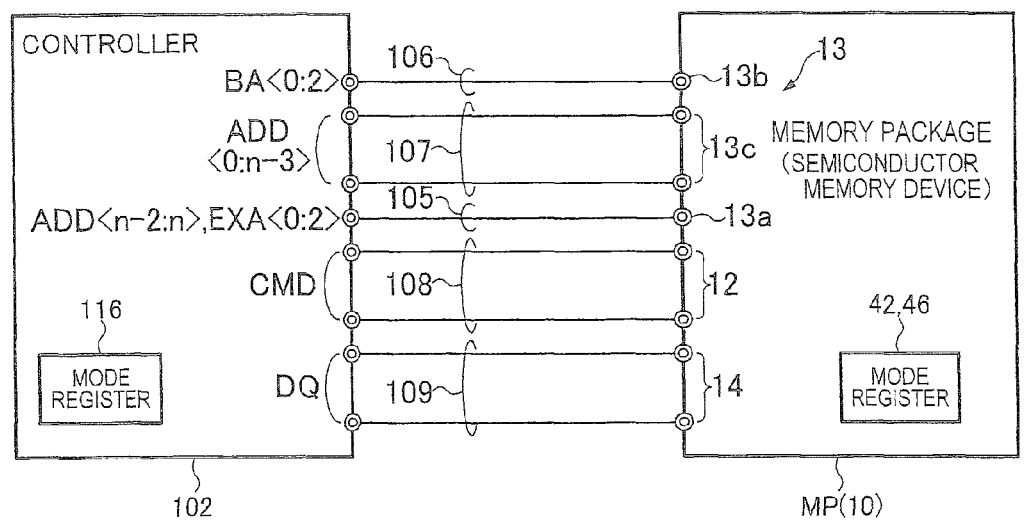
FIG. 11 is a diagram schematically showing the connection between a controller 102 and a memory package MP.

FIG. 11 is a diagram schematically showing the connection between the controller 102 and a memory package MP (semiconductor memory device 10).

As shown in FIG. 11, an address wiring 105, an address wiring 106, an address wiring 107, and a command wiring 108 are formed between the controller 102 and the memory package MP. The address wiring 105 supplies the layer address EXA0 to EXA2 output from the controller 102 to the chip address terminal 13a of the memory package MP. The address wiring 106 supplies the bank address BA0 to BA2 output from the controller 102 to the bank address terminal 13b of the memory package MP. The address wiring 107 supplies the row address RA or the column address CA output from the controller 102 to the row/column address terminals 13c of the memory package MP. The command wiring 108 supplies various commands output from the controller 102 to the command terminals 12 of the memory package MP. In addition, a data wiring 109 intended for the transmission and reception of read data and write data is formed between the controller 102 and the memory package MP.

The controller 102 also has a mode register 116. The settings in the mode registers 42 and 64 provided on the side of the memory package MP vary with the setting in the mode register 116 provided in the controller 102. Consequently, when the first operation mode is set in the mode register 116 on the side of the controller 102, the mode registers 42 and 64 on the side of the memory package MP are also set to the first operation mode. Similarly, when the second operation mode is set in the mode register 116 on the side of the controller 102, the mode registers 42 and 64 on the side of the memory package MP are also set to the second operation mode. The controller 102 can thus bring the memory package MP into the first operation mode to handle it as a memory of 64-bank configuration, and can bring the memory package MP into the second operation mode to handle it as a memory of 8-bank configuration.

In the first operation mode, as described above, the layer address EXA0 to EXA2 is supplied to the chip address terminal 13a through the address wiring 105. In the second operation mode, part An-2 to An of the row address RA is supplied to the chip address terminal 13a through the address wiring 105.

Figure 12:
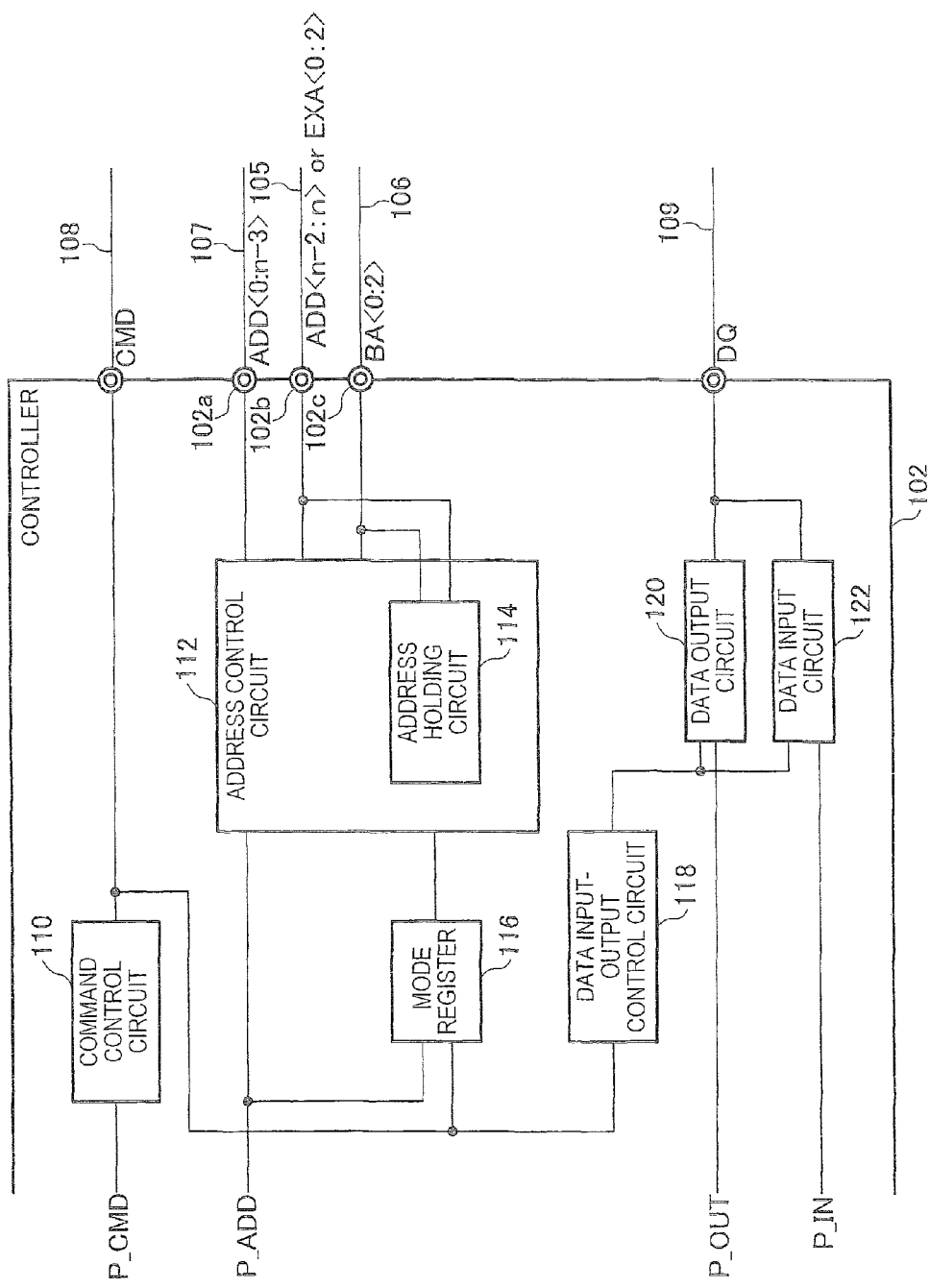
FIG. 12 is a functional configuration diagram of part of the controller 102.

FIG. 12 is a functional configuration diagram of part of the controller 102.

As shown in FIG. 12, an internal command P_CMD in the controller 102 is sent out from a CMD terminal via a command control circuit 110. The command sent out from the CMD terminal is supplied to the memory package MP through the command wiring 108. The commands to be output from the command circuit 110 include row commands and column commands. When the internal command P_CMD designates mode register setting, the command control circuit 110 overwrites the setting in the mode register 116 with an internal address P_ADD. That is, the command control circuit 110 is capable of rewriting by means of the internal command P_CMD and the internal address P_ADD.

The internal address P_ADD is input to an address control circuit 112. Of the internal address P_ADD input to the address control circuit 112, part consisting of the address signal A0 to An-3 is supplied to the memory package MP through the address terminal 102a and the address wiring 107. Part consisting of the address signal An-2 to An (layer address EXA0 to EXA2) is supplied to the memory package MP through the address terminal 102b and the address wiring 105. The bank address BA0 to BA2 is supplied to the memory package MP through the address terminal 102c and the address wiring 106.

If the first operation mode is set in the mode register 116, the address control circuit 112 outputs the layer address EXA0 to EXA2 (=An-2 to An), bank address BA0 to BA2, and row address RA (=A0 to An-3) when the command control circuit 110 outputs a row command. The address control circuit 112 outputs the layer address EXA0 to EXA2 (=An-2 to An), bank address BA0 to BA2, and column address CA (=A0 to An-3) when the command control circuit 110 outputs a column command.

On the other hand, if the second operation mode is set in the mode register 116, the address control circuit 112 outputs the bank address BA0 to BA2 and row address RA (=A0 to An) when the command control circuit 110 outputs a row command. The address control circuit 112 outputs the bank address BA0 to BA2 and column address CA (=A0 to An-3) when the command control circuit 110 outputs a column command. This is the same as described with reference to FIG. 6.

The address control circuit 112 includes an address holding circuit 114. The address holding circuit 114 is a circuit for holding the layer address EXA0 to EXA2 and the bank address BA0 to BA2 to be output in response to a row command.

If the first operation mode is set in the mode register 116, the layer address EXA0 to EXA2 and the bank address BA0 to BA2 held by the address holding circuit 114 are output in response to a column command. This makes it possible to supply the same layer address EXA0 to EXA2 and bank address BA0 to BA2 to the memory package MP both when a row command is issued and when a column command is issued. If the second operation mode is set in the mode register 116, the bank address BA0 to BA2 held by the address holding circuit 114 is output in response to a column command. This makes it possible to supply the same bank address BA0 to BA2 to the memory package MP both when a row command is issued and when a column command is issued.

The output of the command control circuit 110 is also supplied to a data input-output control circuit 118. The data input-output control circuit 118 controls a data output circuit 120 and a data input circuit 122 according to the command that is output from the command control circuit 110. If the command output from the command control circuit 110 indicates a write command, the data output circuit 120 outputs internal write data P_OUT to the data wiring 109 through the DQ terminal. If the command output from the command control circuit 110 indicates a read command, the data input circuit 122 outputs read data that is input through the data wiring 109 and the DQ terminal to a not-shown internal circuit as internal read data P_IN.

Figure 13:
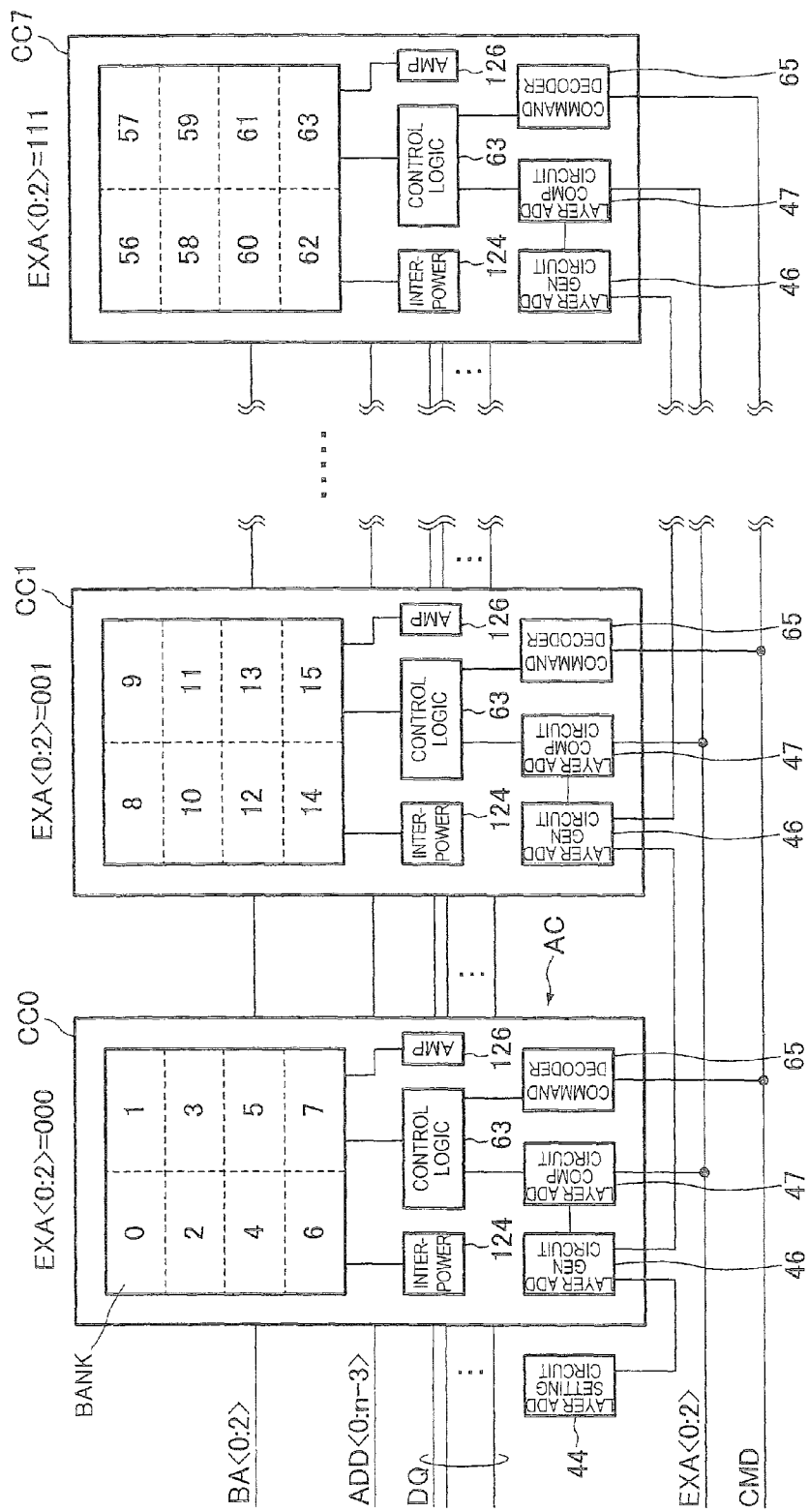
FIG. 13 is a schematic block diagram showing extracted circuits that pertain to bank selection (access control circuit) when the memory package MP is in the first operation mode.

FIG. 13 is a schematic block diagram showing extracted circuits that pertain to bank selection (access control circuit) when the memory package MP is in the first operation mode.

When the memory package MP is in the first operation mode, the supplied layer address EXA0 to EXA2 is input to the layer address comparing circuits 47 both when a row command is issued and when a column command is issued. As described with reference to FIG. 5, each layer address comparing circuit 47 compares the layer address LID unique to that core chip CC0 to CC7, set in the layer address generating circuit 46, with the layer address EXA and activates the control logic circuit 63 in the subsequent stage if the two addresses coincide with each other. Consequently, the control logic circuit 63 performs a predetermined operation according to a command that is supplied through the command decoder 65.

As described previously, when entering in the first operation mode, the controller 102 supplies the same layer address EXA0 to EXA2 when issuing a row command and when issuing a column command, and the layer address comparing circuit 47 makes the comparing operation both when a row command is issued and when a column command is issued. The controller 102 also supplies the same bank address BA0 to BA2 when issuing a row command and when issuing a column command. Based on the layer address EXO to EXA2 and the bank address BA0 to BA2 that are supplied at the time of issuance of a row command, a row access is made to a predetermined bank in a predetermined core chip CC0 to CC7. Based on the layer address EXA0 to EXA2 and the bank address BA0 to BA2 that are supplied at the time of issuance of a column command, a column access is made to a predetermined bank in a predetermined core chip CC0 to CC7. This mean that it is not needed to store a coincidence signal or the like when a coincidence of the layer addresses is detected at the time of issuance of a row command, and perform a column access using the coincidence signal stored. In short, the layer address EXA0 to EXA2 can be considered as part of the so-called bank address.

As shown in FIG. 13, the core chips CC0 to CC7 included in the memory package MP have respective independent internal power supplies 124. The number of active commands that a single core chip can accept within a certain period, e.g., 30 ns is limited to, for example, four by the capacity of the internal power supply 124. Such a limitation, however, will not apply to between different core chips. The core chips CC0 to CC7 also have respective independent amplifiers 126, which prevent data collision between the same banks (such as banks 0) that belong to different core chips.

For example, even if an access to the bank 0 of the core chip CC1 (=bank 8) is attempted while the bank 0 of the core chip CC0 is being accessed, the access can be properly made without load concentration on a certain internal power supply 124 and without data collision.

Figure 14:
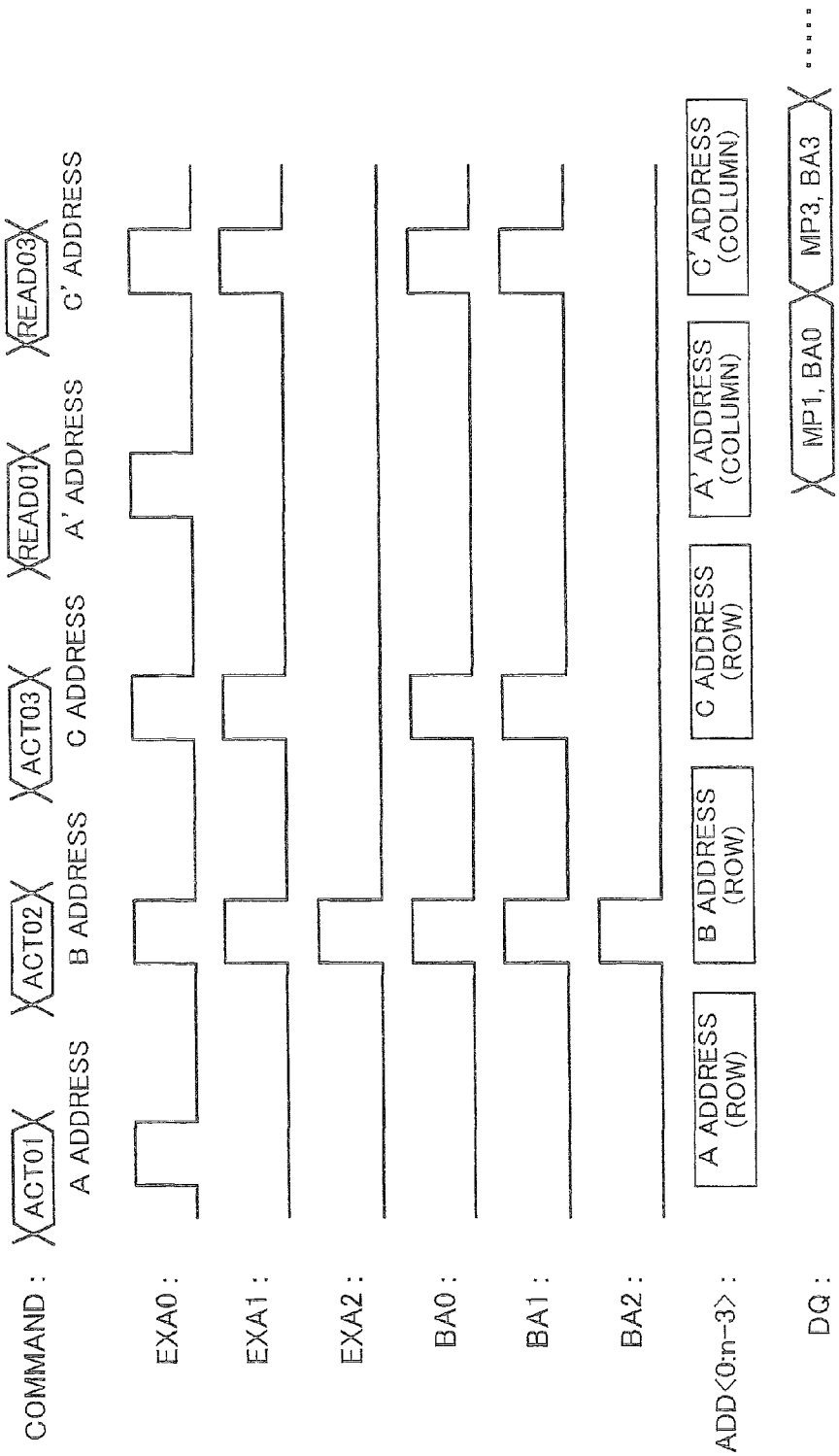
FIG. 14 is a timing chart where commands are issued in succession in the first operation mode.

FIG. 14 is a timing chart where commands are issued in succession in the first operation mode.

In the example shown in FIG. 14, a row address that specifies a layer address EXA=001 (core chip CC1) and a bank address BA=000 (bank 0) is initially input in synchronization with an active command ACT01. The address will be referred to as an A address. The A address is a row address.

Next, a row address that specifies a layer address EXA=111 (core chip CC7) and a bank address BA=111 (bank 7) is input in synchronization with an active command ACT02. The address will be referred to as a B address. The B address is a row address.

A row address that specifies a layer address EXA=011 (core chip CC3) and a bank address BA=011 (bank 3) is input in synchronization with an active command ACT03. The address will be referred to as a C address. The C address is a row address.

In the example shown in FIG. 14, a read command READ01 signal corresponding to the active command ACT01 is issued after the specification of the C address (row address). The layer address EXA=001 (core chip CC1) and the bank address BA=000 (bank 0) are input with a column address also at this time. The column address will be referred to as an A' address. Data is output from memory cells that are specified by the A address and the A' address.

Next, a read command READ03 corresponding to the active command ACT03 is issued. The layer address EXA=011 (core chip CC3) and the bank address BA=011 (bank 3) are input with a column address also at this time. The column address will be referred to as a C' address. Data is output from memory cells that are specified by the C address and the C' address.

As described above, when in the first operation mode, a core chip and a bank are specified both when a row command is issued and when a column command is issued. The controller 102 can thus handle the memory package MP as a memory of 64-bank configuration with improved access efficiency.

Figure 15:
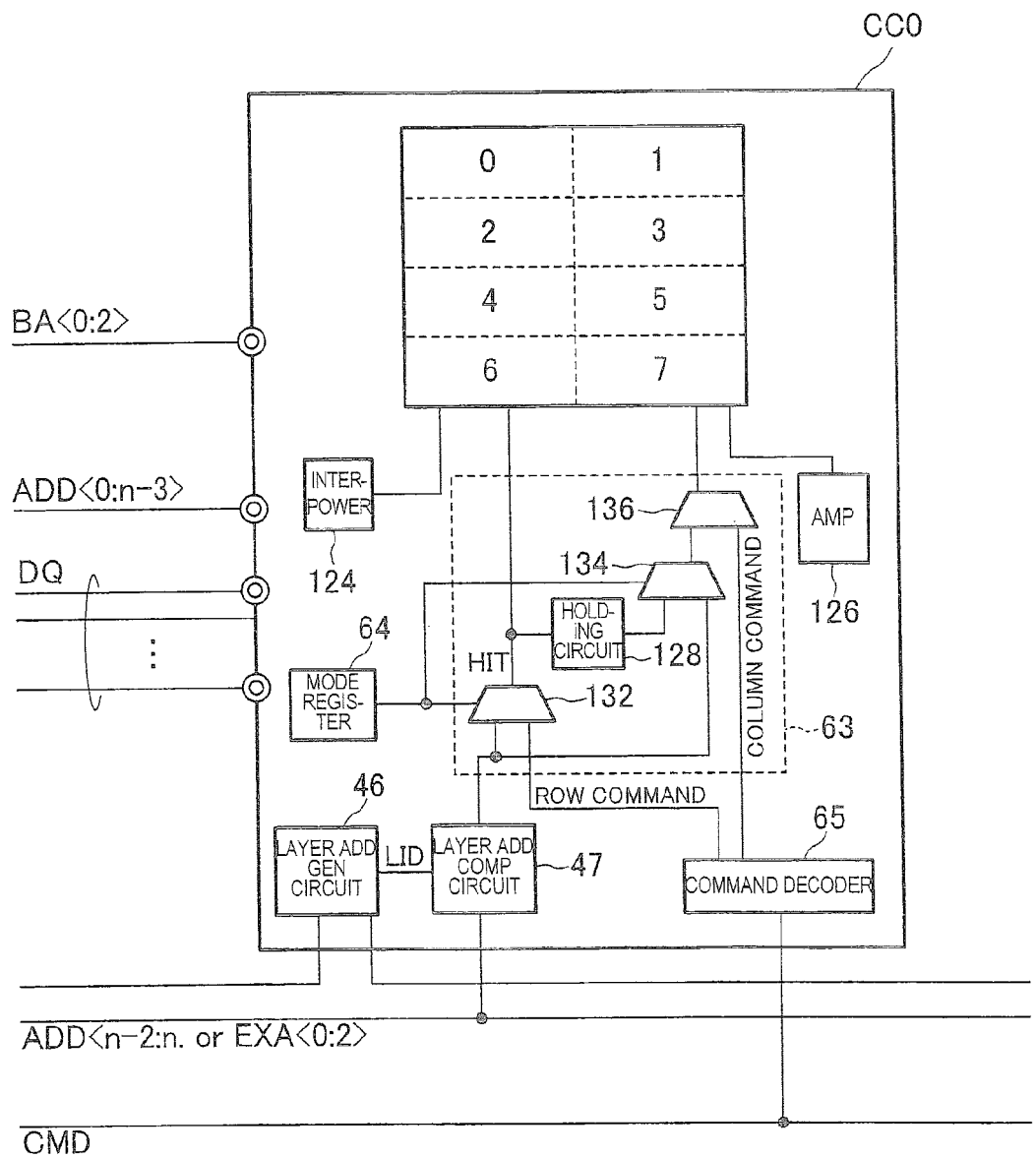
FIG. 15 is a schematic block diagram showing extracted circuits that pertain to the bank selection when the memory package MP is in the second operation mode.

FIG. 15 is a schematic block diagram showing extracted circuits that pertain to bank selection (access control circuit) when the memory package MP is in the second operation mode.

If the memory package MP is in the second operation mode, the controller 102 will not supply the layer address EXA0 to EXA2 when issuing a column command. It is therefore needed to store a coincidence signal or the like when a coincidence of the layer addresses is detected at the time of issuance of a row command, and perform a column access using the coincidence signal stored. For such a purpose, there is provided a holding circuit (coincidence signal holding circuit) 128.

More specifically, when the layer address comparing circuit 47 detects a coincidence between the layer address LID and the layer address EXA at the time of issuance of a row command, a circuit 132 is activated by the coincidence signal HIT and the row command is supplied to the corresponding bank. While entering in the first operation mode, the coincidence signal HIT is not held by the holding circuit 128, but the coincidence signal HIT here is held by the holding circuit 128 in the second operation mode. Next, a column command is issued. If in the first operation mode, a layer address EXA is supplied and the foregoing operation is performed. When entering in the second operation mode, it is unknown from the address signal alone which of the core chips CC0 to CC7 is being accessed since no layer address EXA is supplied at the time of issuance of the column command. When entering in the second operation mode, however, the coincidence signal HIT held by the holding circuit 128 allows the issued column command to be properly supplied through circuits 134 and 136.

FIG. 16 is a chart showing the relationship between the number of layers of 2 Gbit memory cores MC and address configuration.

The semiconductor memory device 10 according to the present embodiment includes a stack of eight core chips CC0 to CC7 as previously described, whereas all the eight core chips CC0 to CC7 need not be used. For example, if one of the core chips is defective, three non-defective ones can be fixed into an inactive state so that only four core chips are put to use. Similarly, if five of the core chips are defective, a non-defective one can be fixed into an inactive state to use only two. Core chips can be deactivated by the defective chip signal DEF which is supplied from the defective chip information holding circuit 33. Option 1 is selected when using two core chips. Option 2 or 3 is selected when using four core chips. Option 4 is selected when using eight core chips. As shown in FIG. 16, the bits of the address signal to be used as the layer address vary depending on the option selected.

The address assignment need not be fixed with respect to the number of core chips to use. For example, like options 2 and 3, the address assignment may be changed to switch the page size for the same number of core chips used. Even in such a case, the bits of the address signal to be used as the layer address vary depending on the option selected.

Figure 17:
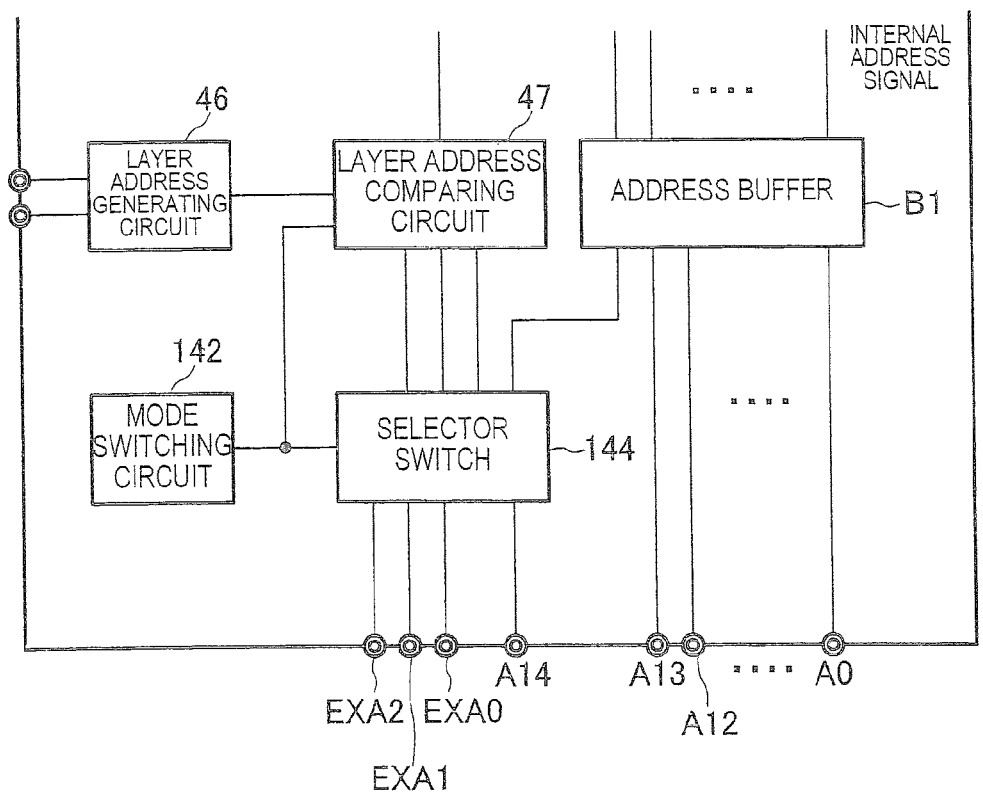
FIG. 17 is a block diagram showing extracted parts pertaining to option selection.
Figure 18:
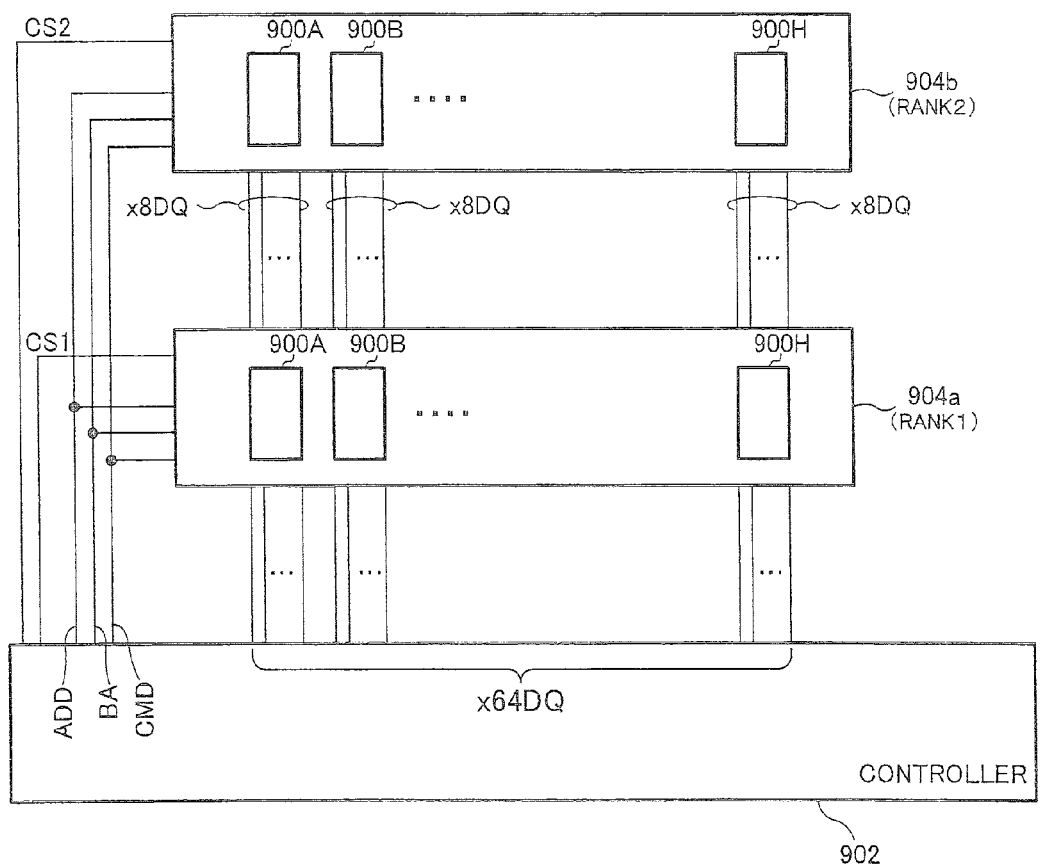
FIG. 18 is a schematic diagram for explaining the connection between a typical memory module and a controller.

FIG. 17 is a block diagram showing extracted part that pertains to the option selection.

In the example shown in FIG. 17, the option selection is performed by a mode switching circuit 142. The mode switching circuit 142 may be a ROM such as fuses. Part of the mode register 64 may be used. The output of the mode switching circuit 142 is supplied to a selector switch 144 and the layer address comparing circuit 47. The selector switch 144 supplies each bit of the address signal to either the address comparing circuit 47 or an address buffer B1 according to the option selected, so that the address comparing circuit 47 makes the bit(s) corresponding to the option selected a target for comparison on.

For example, when option 3 is selected, the selector switch 144 supplies the bits A15 and A14 (layer address) of the address signal to the address comparing circuit 47, and the bits A13 to A0 (row address RA/column address CA) to the address buffer B1. At option 3, the row address RA that is input at the time of issuance of an active command is one bit fewer than in the other modes. The page size at option 3 is thus 2 Kbytes while the page size in the other modes is 1 Kbytes.

It is apparent that the present invention is not limited to the above embodiments, but may be modified and changed without departing from the scope and spirit of the invention.

For example, in the above described embodiment, the DDR3-type SDRAM is used as the core chip, but the present invention is not limited thereto. Accordingly, the core chip may be a DRAM other than the DDR3-type and may be a semiconductor memory (SRAM, PRAM, MRAM, flash memory, etc.) other than the DRAM. All of the core chips do not need to be laminated and all or part of the core chips may be two-dimensionally disposed. The number of core chips is not restricted to 8.

What is claimed is:

1. A system comprising:
   a control chip including:
      a plurality of command terminals receiving a plurality of command signals, respectively;
      a command decoder coupled to the command terminals, the command decoder being configured to output an internal command in response to the command signals; and
      a layer address buffer configured to output a layer address each time the command decoder outputs a row command as the internal command and outputs a column command as the internal command; and
   a plurality of core chips stacked with one another, each of the core chips being configured to receive the, row command and the layer address output together with the row command, to receive the column command and the layer address output together with the column command, and to free from receiving the command signals.

2. The system as claimed, in claim 1, wherein the control chip is stacked with the core chips.

3. The system as claimed in claim 1, wherein the control chip includes a clock terminal to receive an external clock signal and an internal clock generating circuit to generate an Internal clock signal based on the external clock signal, each of the core chips being configured to receive the internal clock signal and to be free from receiving the external clock signal.

4. The system as claimed in claim 1, wherein each of the core chips includes a plurality of memory cells to store data and the controller is free from a memory cell.

5. The system as claimed in claim 1, wherein the core chips include layer address generating circuits, respectively, and the layer address generating circuits are connected in series such that an Output node of a preceding one of the layer address generating circuits is connected to an input node of a succeeding one of the layer address generating circuits.

6. The system as claimed in claim 5, wherein the row command is performed on a selected one of the core chips when layer information stored in the layer address generating circuit of the selected one of the core chips is coincident with the layer address output together with the row command.

7. The system as claimed in claim 5, wherein the column command is performed on the selected one of the core chips when the layer information stored in the layer address generating circuit of the selected one of the core chips is coincident with the layer address output together with the column command.

\* \* \* \* \*